US006870755B2

(12) United States Patent
Rinerson et al.

(10) Patent No.: US 6,870,755 B2
(45) Date of Patent: Mar. 22, 2005

(54) RE-WRITABLE MEMORY WITH NON-LINEAR MEMORY ELEMENT

(75) Inventors: Darrell Rinerson, Cupertino, CA (US); Christophe J. Chevallier, Palo Alto, CA (US); Steven W. Longcor, Mountain View, CA (US); Wayne Kinney, Emmett, ID (US); Edmond R. Ward, Monte Sereno, CA (US); Steve Kuo-Ren Hsia, San Jose, CA (US)

(73) Assignee: Unity Semiconductor Corporation

( * ) Notice: Subject to any disclaimer, the term of this patent is extended or adjusted under 35 U.S.C. 154(b) by 28 days.

(21) Appl. No.: 10/604,556

(22) Filed: Jul. 30, 2003

(65) Prior Publication Data

US 2004/0170040 A1 Sep. 2, 2004

Related U.S. Application Data

(60) Provisional application No. 60/400,849, filed on Aug. 2, 2002, provisional application No. 60/422,922, filed on Oct. 31, 2002, and provisional application No. 60/424,083, filed on Nov. 5, 2002.

(51) Int. Cl.$^7$ .............................................. G11C 11/00
(52) U.S. Cl. ....................................................... 365/148
(58) Field of Search ................................ 365/148, 157, 365/158, 159

(56) References Cited

U.S. PATENT DOCUMENTS

| 5,991,193 | A | 11/1999 | Gallagher et al. ........... 365/171 |
| 6,204,139 | B1 | 3/2001 | Liu et al. ..................... 438/385 |
| 6,331,944 | B1 | 12/2001 | Monsma et al. ............. 365/171 |
| 6,625,055 | B1 * | 9/2003 | Smith et al. ................. 365/148 |
| 6,741,490 | B2 * | 5/2004 | Baker .......................... 365/148 |
| 6,768,665 | B2 * | 7/2004 | Parkinson et al. ........... 365/113 |

OTHER PUBLICATIONS

Liu, S.Q., et al., "Electric–pulse–induced reversible resistance change effect in magnetoresistive films", Applied Physics Letters, vol. 76, No. 19, May 8, 2000, 2749–2651.

Liu, S.Q., et al., "A New Concept For Non–Volatile Memory: Electric–Pulse Induced Reversible Resistance Change Effect In Magnetoresistive Films", Space Vacuum Epitaxy Center, University of Huston, Huston TX, 7 Pages.

Beck, A. et al., "Reproducible switching effect in thin oxide films for memory applications," Applied Physics Letters, vol. 77, No. 1, Jul. 3, 2000,139–141.

Rossel, C. et al., "Electrical current distribution across a metal–insulator–metal structure during bistable switching," Journal of Applied Physics, vol. 90, No. 6, Sep. 15, 2001, 2892–2898.

Watanabe, Y. et al., "Current–driven insulator–conductor transition and nonvolatile memory in chromium–doped $SrTiO_3$ single crystals," Applied Physics Letters, vol. 78, No. 23, Jun. 4, 2001, 3738–3740.

* cited by examiner

Primary Examiner—Tan T. Nguyen
(74) Attorney, Agent, or Firm—Morgan Malino

(57) ABSTRACT

A re-writable memory that uses resistive memory cell elements with non-linear IV characteristics is disclosed. Non-linearity is important in certain memory arrays to prevent unselected cells from being disturbed and to reduce the required current. Non-linearity refers to the ability of the element to block the majority of current up to a certain level, but then, once that level is reached, the element allows the majority of the current over and above that level to flow.

18 Claims, 10 Drawing Sheets

RE-WRITABLE MEMORY WITH NON-LINEAR MEMORY ELEMENT

CROSS REFERENCE TO RELATED APPLICATIONS

This application claims the benefit of U.S. Provisional Application No. 60/400,849, filed Aug. 2, 2002, the U.S. Provisional Application No. 60/422,922, filed Oct. 31, 2002, and the U.S. Provisional Application No. 60/424,083, filed Nov. 5, 2002, all of which are incorporated herein by reference in their entireties and for all purposes. This application is related to the following U.S. patent applications: U.S. application Ser. No. 10/360,005, filed Feb. 7, 2003; U.S. application Ser. No. 10/330,512, filed Dec. 26, 2002 now U.S. Pat No. 6,753,561; application Ser. No. 10/330,153, filed Dec. 26, 2002; application Ser. No. 10/330,964, filed Dec. 26, 2002; application Ser. No. 10/330,170, filed Dec. 26, 2002; application Ser. No. 10/330,900, filed Dec. 26, 2002; application Ser. No. 10/330,150, filed Dec. 26, 2002 now U.S. Pat. No. 6,798,685; application Ser. No. 10/330,965, filed Dec. 26, 2002; and the applications that are titled "Re-writable Memory with Multiple Memory Layers", "Layout Of Driver Sets In A Cross Point Memory Array," "Line Drivers That Fit Within A Specified Line Pitch," "Line Drivers That Use Minimal Metal Layers," and "Cross Point Memory Array With Fast Access Time," all of which were filed on Jul. 1, 2003. All of the above applications are hereby incorporated herein by reference in their entireties and for all purposes.

BACKGROUND OF INVENTION

1. Field of the Invention

The present invention relates generally to memory, and more specifically to rewritable memory.

2. Description of the Related Art

A random access memory ("RAM") type of memory is typically associated with the main memory available to computer programs and similar devices. RAM memory is often contrasted with a read-only memory ("ROM") type of memory, which is typically associated with a special memory that is either not changed, or changed relatively infrequently. RAM mostly comprises SRAM and DRAM. ROM mostly comprises Flash memory, EPROM, OTP, EEPROM, PROM and ROM. Some devices such as NovRAM and Battery powered SRAM are hybrid devices using more than one technology.

Although SRAM, with very fast access times, is the memory of choice for computer applications, its volatility, large size and stand-by current limit the total size and applications of the memory. Non-volatile memories such as Flash memory are slower to program, and in some cases must erase a large block of memory before being reprogrammed. DRAM has the smallest cell size, but necessitates a complex refresh algorithm, and is volatile. For new applications, away from PC applications and into portable applications such as cell phones, personal digital assistants (PDA), digital cameras, camcorders, removable "keychain" or "USB" disks, the key issues are nonvolatility and low power consumption.

Regardless of how the memory is used, RAM and ROM overlap in many respects. Both types of memory can allow random access reads. Both types of memory can be relatively fast or relatively slow. Although all ROMs are non-volatile, so are some RAMs. Although most ROMs cannot change their data once programmed, some ROMs can be re-programmed. The only consistent difference between RAM and ROM is that ROM is always non-volatile and RAM is always re-writable.

The ROMs that are capable of modifying their data typically require long write cycles that erase entire blocks of data prior to new data being written. For example, UV light might be applied to an entire memory block in order to "repair" fused connections so that the block can be re-written with new data. RAM, on the other hand, can read or write to a randomly accessed byte of memory, typically performing either operation in a standard cycle.

Conventional nonvolatile RAM and ROM requires three terminal MOSFET-based devices. The layout of such devices are not ideal, usually requiring feature sizes of at least $8f^2$ for each memory cell, where f is the minimum feature size.

However, not all memory elements require three terminals. Certain conductive metal oxides (CMOs), for example, can retain a resistive state after being exposed to an electronic pulse, which can be generated from two terminals. U.S. Pat. No. 6,204,139, issued Mar. 20, 2001, to Liu et al., incorporated herein by reference for all purposes, describes some perovskite materials that exhibit such characteristics. The perovskite materials are also described by the same researchers in "Electric-pulse-induced reversible resistance change effect in magnetoresistive films," Applied Physics Letters, Vol. 76, No. 19, 8 May 2000, and "A New Concept for Non-Volatile Memory: The Electric-Pulse Induced Resistive Change Effect in Colossal Magnetoresistive Thin Films," in materials for the 2001 Non-Volatile Memory Technology Symposium, all of which are hereby incorporated by reference for all purposes.

Similarly, the IBM Zurich Research Center has also published three technical papers that also discuss the use of metal oxide material for memory applications: "Reproducible switching effect in thin oxide films for memory applications," Applied Physics Letters, Vol. 77, No. 1, 3 Jul. 2000, "Current-driven insulator-conductor transition and nonvolatile memory in chromium-doped $SrTiO_3$ single crystals," Applied Physics Letters, Vol. 78, No. 23, 4 Jun. 2001, and "Electric current distribution across a metal-insulator-metal structure during bistable switching," Journal of Applied Physics, Vol. 90, No. 6, 15 Sep. 2001, all of which are hereby incorporated by reference for all purposes.

Similarly, magnetic RAM (MRAM) requires only two terminals to deliver a magnetic field to the memory element. Other two terminal devices include Ovonic Unified Memory (OUM), which uses chalcogenic layers of material, and various types of ferroelectric memory. With only two terminals, it has been theorized that memory can be arranged in a cross point architecture.

However, mere recognition that a two terminal memory element is theoretically capable of being placed in a cross point array does not solve many of the non-trivial problems associated with actually creating such a device.

SUMMARY OF INVENTION

The present invention provides a 2-terminal re-writable memory cell that includes a non-linear resistive memory element that can store non-volatile information. The resistance of the non-linear resistive memory element can be reversibly written to different values, whereby the resistance of the non-linear resistive memory is used to determine the stored information.

The non-linearity of the non-linear resistive memory element refers to the ability of the element to block the majority of current up to a certain level, but then, once that level is reached, the element allows the majority of the current over and above that level to flow. In some embodiments, the non-linear portion of the memory element is induced at an interface between an electrode and a conductive metal oxide. In other embodiments, the non-linearity results from two backward diodes in a back to back configuration.

Another embodiment of the invention includes a plurality of x-direction conductive lines, a plurality of y-direction conductive lines, and a plurality of memory cells. Each conductive x-direction line is patterned in a first direction and each conductive y-direction line is patterned in a second direction orthogonal to the first direction. Each memory cell is accessible for reading or writing through selection of an x-direction conductive line and a y-direction conductive line such that a memory cell is located at or near the intersection of the selected conductive array lines. Additionally, each memory cell includes a non-linear resistive element.

In yet another embodiment of the invention, the memory cell includes a bottom electrode, a top electrode and at least one conductive metal oxide sandwiched in-between the bottom and top electrodes. The memory cell exhibits a non-linear IV characteristic between the top and bottom electrodes.

In yet another embodiment of the invention, the memory cell includes a first terminal, a non linear device, a non-volatile resistive memory element and a second terminal. The first terminal that is capable of being placed at a first voltage potential. The non-linear device is electrically coupled to the first terminal. The non-volatile resistive memory element is electrically coupled to the non-linear device and can be reversibly written to different values, whereby the resistance of the non-linear resistive memory is used to determine the stored information. The second terminal is capable of being placed at a second voltage potential and is electrically coupled to the non-volatile resistive memory element.

BRIEF DESCRIPTION OF DRAWINGS

The invention may best be understood by reference to the following description taken in conjunction with the accompanying drawings, in which.

It is to be understood that, in the drawings, like reference numerals designate like structural elements. Also, it is understood that the depictions in the figures are not necessarily to scale.

DETAILED DESCRIPTION

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessarily obscuring the present invention.

The Cross Point Array

Figure 1:
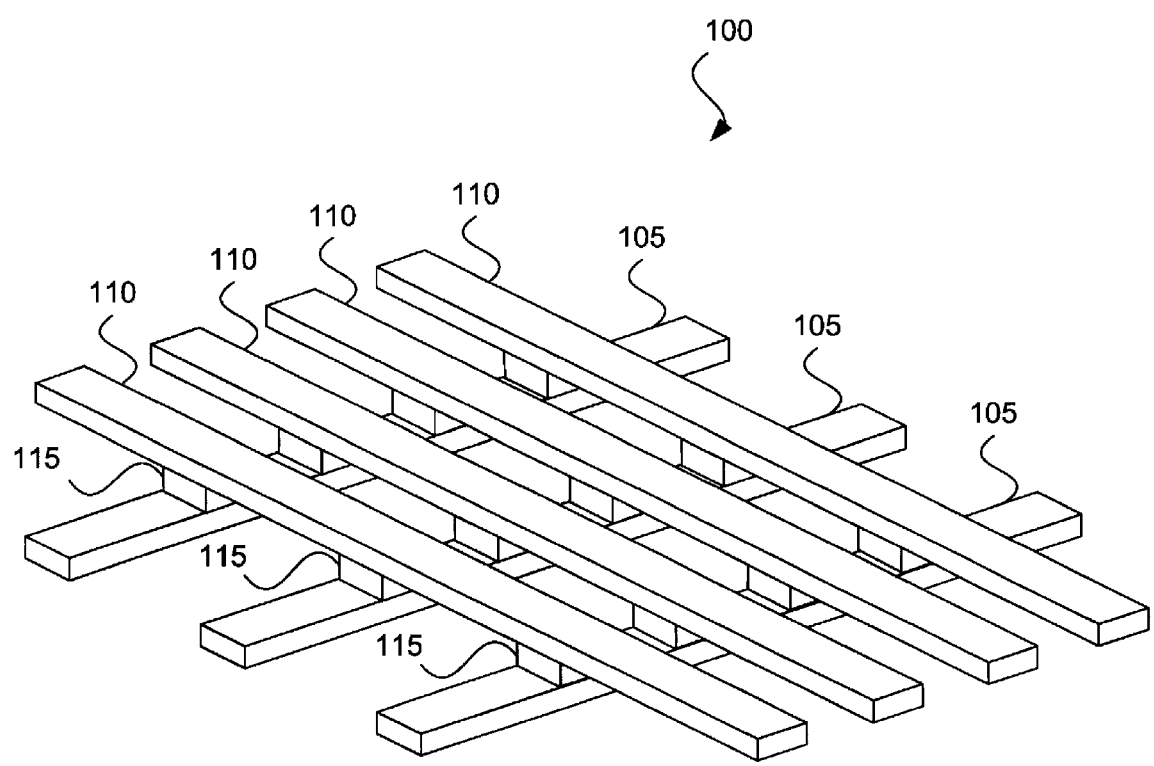
FIG. 1 depicts a perspective view of an exemplary cross point memory array employing a single layer of memory.

FIG. 1 depicts an exemplary cross point array 100 employing a single layer of memory. A bottom layer of x-direction conductive array lines 105 is orthogonal to a top layer of y-direction conductive array lines 110. A plurality of memory plugs 115 are located at the intersections of the conductive array lines, each individual memory plug being capable of being uniquely identified and, therefore, uniquely selected by a single x-direction conductive array line and a single y-direction conductive array line.

Conductive array line layers 105 and 110 can be constructed of any conductive material, such as aluminum, copper, tungsten or certain ceramics. Depending upon the material, a conductive array line would typically cross between 64 and 8192 perpendicular conductive array lines. Fabrication techniques, feature size and resistivity of material may allow for shorter or longer lines. Although the x-direction and y-direction conductive array lines can be of equal lengths (forming a square cross point array) they can also be of unequal lengths (forming a rectangular cross point array).

The memory plug layer 115 will typically dictate the requirements of at least the conductive array line layer 105 beneath the memory plug layer 115. Certain fabrication process (e.g., solution based spin on followed by high temperature anneal, pulsed laser deposition, sputtering, and metalorganic chemical vapor deposition) might require that refractory metals be used for conductive array lines so that they may withstand the high temperature fabrication process. However, refractive array lines have higher resistances, which means that a given x-direction conductive array line would not be able to timely access as many memory plugs as a lower resistance conductive array line, reducing the number of memory cells on the cross-point array 100.

Each memory plug in the memory plug layer 115 contains a memory element along with any other materials that may be necessary. The additional materials might include a non-ohmic device, as is described in co-pending application "High Density NVRAM," U.S. application Ser. No. 10/360, 005, filed Feb. 7, 2003, already incorporated by reference. The non-ohmic device exhibits a very high resistance regime for a certain range of voltages ($V_{NO-}$ to $V_{NO+}$) and a very low resistance regime for voltages above and below that range. Together, the memory element and the non-ohmic device cause the memory plug to exhibit a non-linear resistive characteristic.

The Memory Plug

Figure 2:
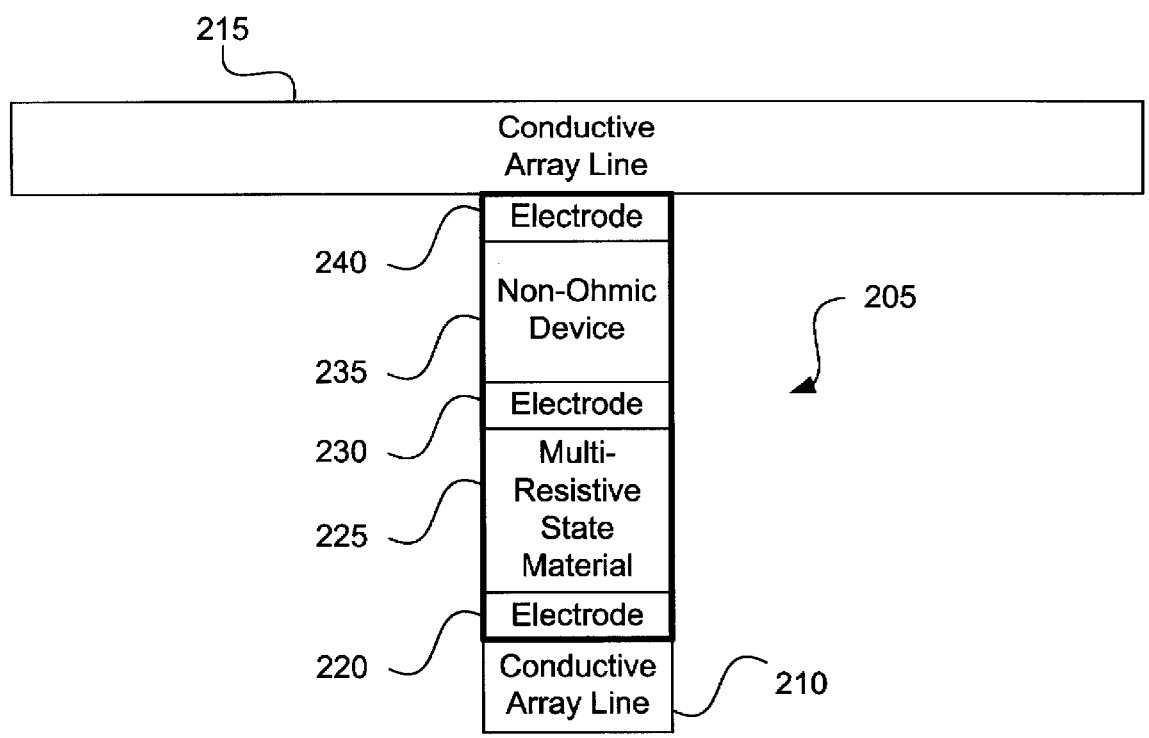
FIG. 2 depicts a side view of an exemplary memory plug with five layers and sandwiched between two conductive array lines.

FIG. 2 depicts a side view of an exemplary memory plug 205 with five layers and sandwiched between two conductive array lines 210 and 215. The five layers are: a first electrode layer 220, a layer of multi-resistive state material 225, a second electrode layer 230, a layer making up the non-ohmic device 235, and a third electrode 240. Some layers may actually be made up of multiple thin films. For example, one type of non-ohmic device 235 uses a three film metal-insulator-metal (MIM) structure. Additionally, not all the layers are required for every memory plug 205 configuration. For example, certain cross point arrays may use means other than the non-ohmic device 235 to prevent unselected memory plugs from being disturbed.

Typical electrodes 220, 230 and 240 commonly used in fabrication include Pt, Au, Ag and Al. If the only purpose of the electrodes 220, 230 and 240 is as a barrier to prevent metal inter-diffusion, then a thin layer of metal, e.g. TiN, could be used. If a seed layer is additionally required, any number of electrically conductive materials can be used for on top of the thin layer of metal. For example, the seed layer could be a conductive perovskite, such as $LaNiO_3$ or $SrRuO_3$ on Pt, a conductive metal oxide, such as $IrO_2$ on Ir or $RuO_2$ on Ru, a noble metal such as Pt on TiN. It will be appreciated that the choice of electrode layers 220, 230 and 240 in combination with the multi-resistive state material layer 225 may affect the properties of the memory element. As such, the memory function is realized either by the multi-resistive state material 225 properties or by the interface between an electrode 220 or 230 and the multi-resistive state material 225.

The multi-resistive state material 225 will generally be a crystalline or polycrystalline structure. One class of multi-resistive state material 225 are perovskites that include two or more metals, the metals being selected from the group consisting of transition metals, alkaline earth metals and rare earth metals. The perovskites can be any number of compositions, including manganites (e.g., $Pr_{0.7}Ca_{0.3}MnO_3$, $Pr_{0.5}Ca_{0.5}MnO_3$ and other PCMOs, LCMOs, etc.), titanates (e.g., STO:Cr), zirconates (e.g., SZO:Cr, $Ca_2Nb_2O_7$:Cr, and $Ta_2O_5$:Cr), and high Tc superconductors (e.g., YBCO). Specifically, $MnO_3$, when combined with the rare earth metals La, Pr or some combination thereof and the alkaline earth metals Ca, Sr or some combination thereof have been found to produce a particularly effective multi-resistive state material 225 for use in the memory plug 205. The compounds that make up this class of multi-resistive state materials 225 include both normal conductive metal oxides and conductive complex metal oxides.

Multi-resistive state materials 225, however, are not limited to perovskites. Specifically, any material that uses trapped charges to modify or alter conductivity could be used in the memory plug 205. Doping different materials (e.g., insulators, conductors, conductive oxides, and/or polymers), for example, may create charge traps by substituting the dopant for crystalline elements. Doping may also be used to create charge traps by interstitially introducing dopants into a crystalline structure. Also, introducing separate physical clusters, or groups of atoms, into a crystalline structure may create charge traps as well.

While the resistance changing effect of the multi-resistive state material 225 is generally not dependent upon its area or its thickness, the resistance value of the multi-resistive state material 225 is dependant on both its area and thickness as well as other properties, such as oxygen content, crystalline structure, and stoichiometry. Similarly, the voltage at which multi-resistive state material 225 switches resistive states is also dependent upon the various properties of the material.

Electrical Properties of the Memory Plug

The various properties of the memory element will determine both the lowest possible resistance state and the highest possible resistive state. Although the highest operational resistive state ($R_0$) of the memory plug 205 does not need to be its highest possible state and the lowest operational resistance state ($R_1$) does not need to be its lowest possible state, designs can set $R_0$ and $R_1$ close to those states for simplicity.

When considering an operative value of the $R_1$ resistive state parasitic resistances that are in series with the memory plug must also be considered. Sources of resistance include the contacts and the vias, the metal interconnect lines, and the driver circuits. Parasitic resistances might total 100–200$\Omega$, which puts a lower limit on the memory plug resistance. While the parasitic resistance may be overcome through more complicated circuit design, such designs typically result in loss of access time, or a larger die size.

The $R_1$ state of the memory plug may have a best value of 10 k$\Omega$ to 100 k$\Omega$. If the $R_1$ state resistance is much less than 10 k$\Omega$, the current consumption will be increased because the cell current is high, and the parasitic resistances will have a larger effect. If the $R_1$ state value is much above 100 k$\Omega$, the RC delays will increase access time. However, workable single state resistive values may also be achieved with resistances as low as 5 k$\Omega$ and as high as 1 M$\Omega$. Typically, a single state memory would have the operational voltages of $R_0$ and $R_1$ separated by a factor of 10.

For example, if 1 volt were used as a read voltage ($V_R$), $R_1$ might be about 100 k$\Omega$ and $R_0$ might be about 1 M$\Omega$, making the current either 10 $\mu$A or 1 $\mu$A, depending on the resistive state. Since large currents can be destructive to semiconductors fabricated to small dimensions, no more than 10 $\mu$A would be desired for a memory circuit in most cases. Once a $V_R$ is identified, a desired write voltage ($V_W$) can also be determined. Not only should $V_W$ be greater than $V_R$, but it should also be far enough away from $V_R$ to allow minor voltage fluctuations (e.g., due to fabrication imperfections) to have a negligible effect on the memory element. Similarly, $V_W$ should be greater than $V_{Wth}$, the threshold at which the resistive material starts to change resistivity, for the same reason. A typical $V_W$ might be about 2 volts, and $V_{Wth}$ might be about 1.5 volts.

Figure 3A:
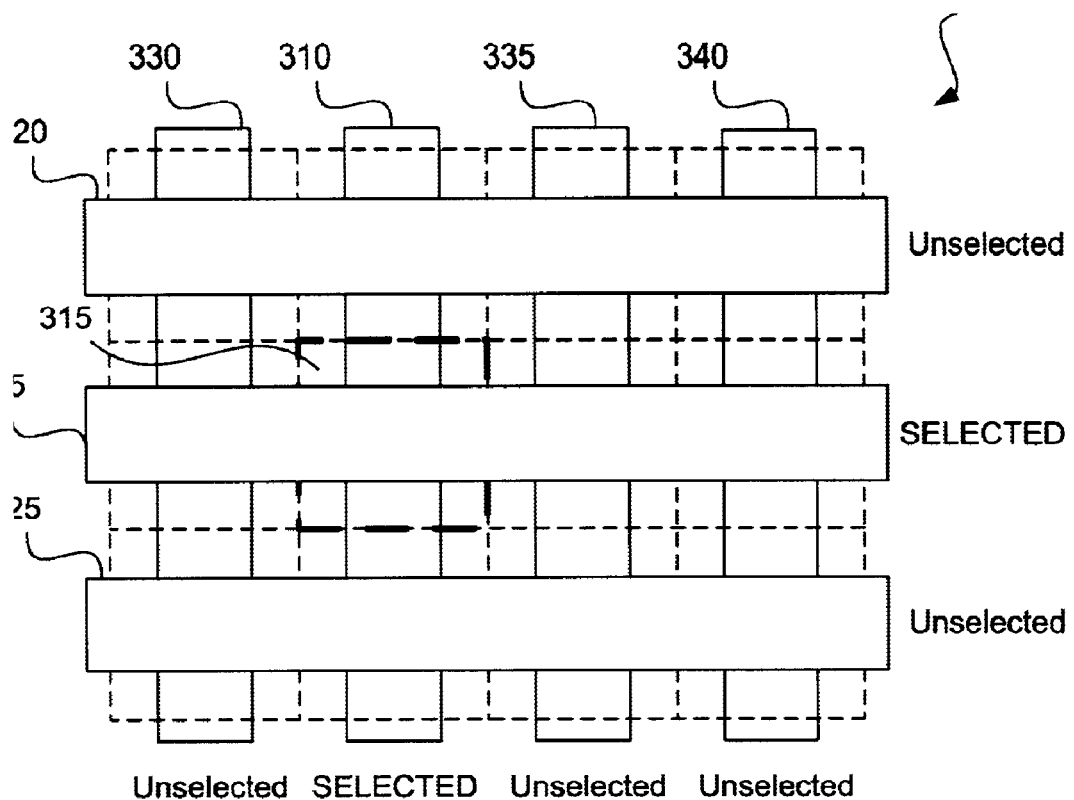
FIG. 3A illustrates selection of a memory cell in the cross point array depicted in FIG. 1.
Figure 3B:
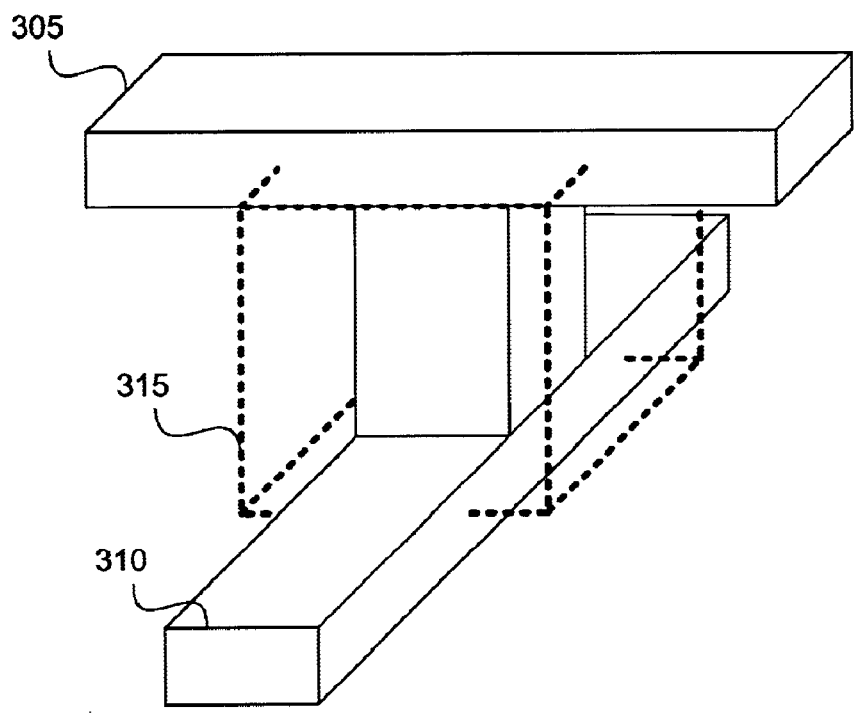
FIG. 3B illustrates the boundaries of the selected memory cell of FIG. 3A.

FIG. 3A illustrates selection of a memory cell 315 in the cross point array 100. The point of intersection between a single x-direction conductive array line 305 and a single y-direction conductive array line 310 uniquely identifies a single memory cell 315. FIG. 3B illustrates the boundaries of the selected memory cell 315. The memory cell a repeatable unit that can be theoretically extended in all dimensions. In certain embodiments, the memory cells are repeated in the z direction (orthogonal to the x-y plane). A preferred method of repeating the memory cells in the z-direction is to use both the bottom and top surfaces of conductive array lines that sandwich memory plugs layers. Therefore, the repeatable cell that makes up the array of memory cells can be considered to be a memory plug, plus ½ of the space around the memory plug, plus ½ of an x-direction conductive array line and ½ of a y-direction conductive array line. Of course, ½ of a conductive array line is merely a theoretical construct, since a conductive array line would generally be the same width, regardless of whether both surfaces of the conductive array line was used. Accordingly, the very top and very bottom layers of conductive array lines (which use only one surface) would typically be fabricated to the same size as all other layers of conductive array lines.

During selection the selected conductive array lines 305 and 310 deliver a voltage to every memory cell associated with those conductive array lines. Therefore, the non-ohmic device must be able to pass current from the minimum voltage seen on a selected memory cell 315 but block at least some current to unselected memory cells. If each conductive array line 305 and 310 supplies half the required voltage of each operation, then ½ $V_W'$ would be the maximum voltage on a single conductive array line and $V_R'$ would be the minimum voltage seen on a selected memory cell 315. $V_W'$ is $V_W$ plus all other voltage drops in the memory cell 315 (e.g., the voltage drop across the non-ohmic device $V_{NO+}$) and $V_R'$ is $V_R$ plus all other voltage drops in the memory cell 315. Accordingly, the selection of only one conductive layer is not sufficient to access a single memory cell array for writing purposes. In embodiments where ½ $V_R'$ is applied by both conductive array lines, the selection of a single conductive layer is also not sufficient to access a single memory layer for reading purposes. However, some decoding circuitry might supply the full read voltage from one conductive array line, then read data from the entire memory layer and simply discard data from unwanted lines.

It should be noted that changes in the resistive property of the memory plugs that are greater than a factor of 10 might be desirable in multi-bit resistive memory cells. Generally, adjusting the pulse width and magnitude of the voltage pulses across the memory element results in multiple resistive states. Since the memory element can be placed into several different resistive states, multi-bit resistive memory cells are possible. For example, the multi-resistive state material might have a high resistive state of $R_{00}$, a medium-high resistive state of $R_{01}$, a medium-low resistive state of $R_{10}$ and a low resistive state of $R_{11}$. Since multi-bit memories typically have access times longer than single-bit memories, using a factor greater than a 10 times change in resistance from $R_{11}$ to $R_{00}$ is one way to make a multi-bit memory as fast as a single-bit memory. For example, a memory cell that is capable of storing two bits might have the low resistive state be separated from the high resistive state by a factor of 100. A memory cell that is capable of storing three or four bits of information might require the low resistive state be separated from the high resistive state by a factor of 1000. Typically, the intermediary resistive states in a multi-bit memory would evenly subdivide the resistive range between the high resistive state and the low resistive state on a logarithmic scale. For example, if a memory cell that held three bits of memory had a low resistive state of 10 kΩ, the six intermediary states might have resistive states of about 26.8 kΩ, 72.0 kΩ, 193 kΩ, 518 kΩ, 1.39 MΩ, and 3.73 MΩ. The highest resistive state would then be 10 MΩ, 1000 times the value of the low resistive state. Each optimal resistive state could easily be calculated by using the relationship $Log(R_{110})=Log(R_{111})+$ Log K; $Log(R_{101})=Log(R_{111})+2$ Log K; $Log(R_{100})=Log(R_{111})+3$ Log K; ... $Log(R_{000})=Log(R_{111})+7$ Log K, where Log K=(⅐) $[Log(R_{000})-Log(R_{111})]$.

Those skilled in the art will appreciate that the above-described voltages are voltages seen by the memory plug 315, and not necessarily the absolute values of the voltages from ground. For example, placing 10 volts on the selected x-direction conductive array line 305 and 6 volts on the selected y-direction conductive array line 310 would still attain a 4-volt drop across the memory plug 315. If the voltage drop across any single unselected memory plug was to be no more than 3 volts, then unselected conductive array lines 320, 325, 330, 335 and 340 would need to be held somewhere between 7 volts and 9 volts in the above example. An opposite polarity voltage drop would then be attained in the above example whenever the selected x-direction conductive array line 305 was held to a smaller voltage than the selected y-direction conductive array line 310.

In many designs the unselected conductive array lines 320, 325, 330, 335 and 340 would be held at a constant voltage, regardless of whether a read or write operation was being performed. Therefore, if the selected x-direction conductive array line 310 were placed at 12 volts, then the y-direction unselected conductive array lines 320 and 325 would need to be held at 9 volts in the above example in order to keep the maximum voltage drop to 3 volts. If symmetry was desired, a write operation might require the x-direction conductive array line 310 be held to 11 volts, the y-direction conductive array line 305 be held to 5 volts and all the unselected conductive array lines 320, 325, 330, 335 and 340 be held to 8 volts (halfway between the voltages of the two conductive array lines 305 and 310 for both read and write operations).

However, in the case where the unselected conductive array lines 320, 325, 330, 335 and 340 are left floating, the unselected memory cells will affect the current read between the selected x-direction conductive array line 305 and the selected y-direction conductive array line 310 as the unselected memory cells form a resistive network in parallel with the selected memory cell 315.

Electrical Properties of the Cross Point Array

Figure 4:
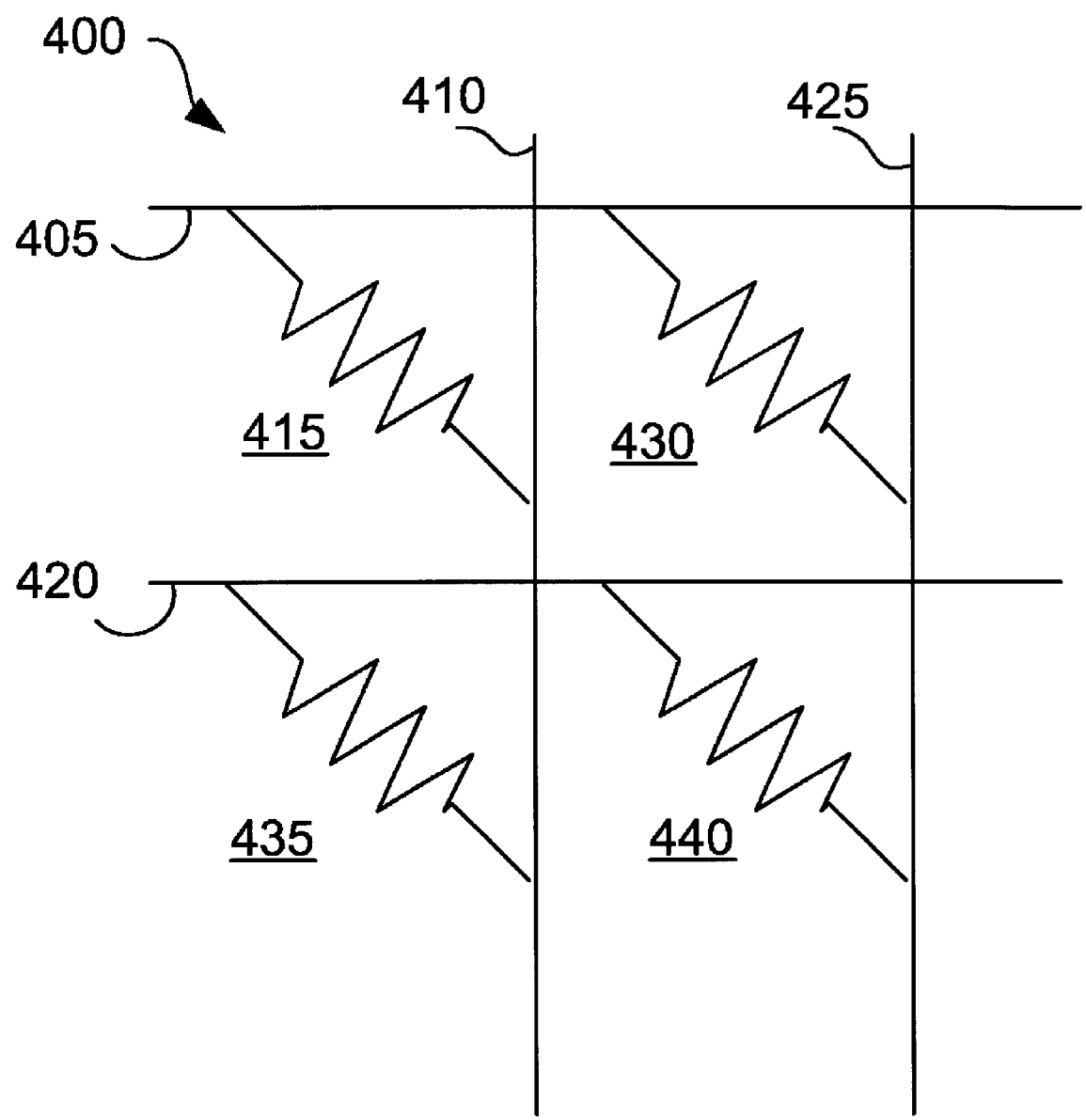
FIG. 4 depicts a circuit diagram of a simplified representation of a cross point memory array with resistive memory elements.

FIG. 4 depicts a simplified representation of a cross point memory array 400. The selected X line 405 and the selected Y line 410 intersect at the selected cell 415. The remaining unselected X lines 420 and the remaining unselected Y lines 425 are each represented as a single group for simplicity. Similarly, the unselected memory cells 430 on the selected X line 405, the unselected memory cells 435 connected to the selected Y line 410, and the unselected cells 440 connected to neither the selected X line 405 nor the selected Y line 410 are also represented as groups for simplicity.

The combination of unselected memory cells 430, 435, and 440 is set in parallel with the selected memory cell 415, and therefore, the current that is read when applying some $V_x$ on line 405 and some $V_y$ on line 410 will be: $(V_x-V_y) \times (R_{415}+R_{430}+R_{435}+R_{440})/(R_{415} \times (R_{430}+R_{435}+R_{440}))$, where $R_{430}$, $R_{435}$, and $R_{440}$ are the resistances of the unselected memory cells 430, 435, and 440 and $R_{415}$ is the resistance of the selected memory cells 415. In large arrays, the combined resistance of the selected cell 415 in parallel with the unselected cells 430, 435, and 440 will be significantly less than the resistance of the selected cell 415 alone. As such, it is not practical to read the resistance of the selected cell 415 with floating lines and unselected cells 430, 435, and 440 that allow current to flow.

Although clamping the unselected lines 420 and 425 at specific voltages reduce the effect of the unselected memory cells 430, 435, and 440, such techniques result in current consumption through unselected cells. For example, if $V_y=-V_x$ and the unselected lines 420 and 425 are held at 0V, the unselected memory cells 435 on the selected Y line 410 will pass a current equal to $V_x/R_{435}$, which can be high if there are a high number of unselected array lines.

As previously discussed, a higher voltage is typically applied on both selected X line 405 and Y line 410 during a write operation. Although the current leakage in other elements is not critical to the selected element, in a large array, the current leakage amplitude could be such that it would require impractically large currents from the line drivers. Further, unselected memory cells 430, 435 and 440 carrying unselected current could have their memory state affected by the unselected current.

Figure 5:
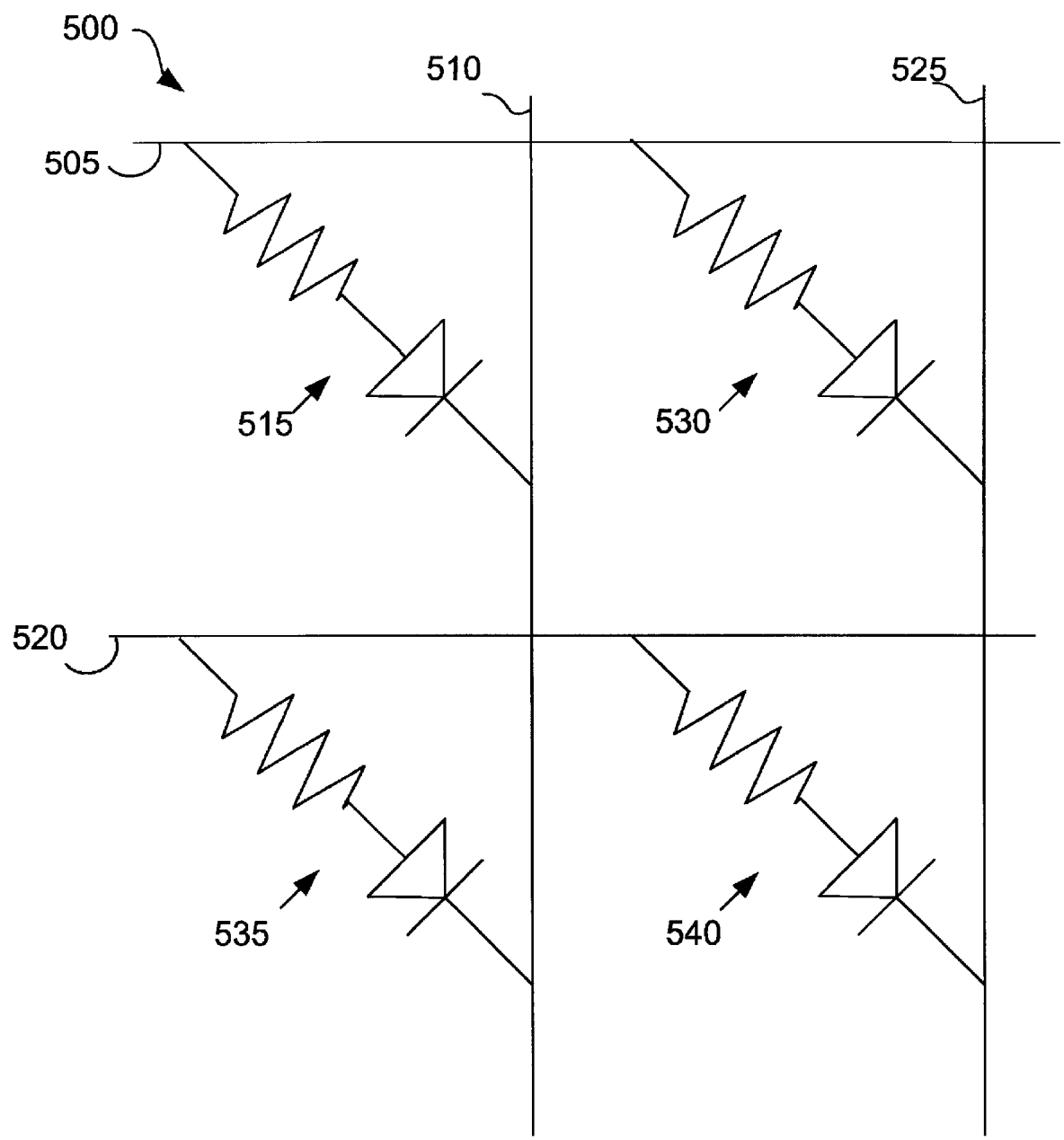
FIG. 5 depicts a circuit diagram of a simplified representation of a cross point memory array with resistive memory elements and diodes.

FIG. 5 depicts an exemplary cross point array 500 where each memory cell includes a diode in series with the memory element. As the voltage $V_x$ is applied on selected X line 505 and $V_y$ is applied to the selected Y line 510, the diodes block the current flow through the unselected memory cells 530, 535 and 540 in series. With unselected lines 520 and 525 left floating the current going from selected X line 505 to selected Y line 510 will pass exclusively through the selected memory cell 515, therefore giving an accurate evaluation of the value of the resistance of the memory cell 515.

During a write operation, the diodes will also block the parasitic current path through unselected memory cells 530, 535 and 540. However, if the unselected lines 520 and 525 are floating then they will be charged by current going through the unselected memory cells 530, 535 and 540. For example, one of the unselected lines that crosses the selected X line 505 will reach $V_x-V_{fwd}$, where $V_{fwd}$ is the forward bias voltage drop across a diode, since line 505 is at $V_x$ (which, during a write operation, might be ½ $V_W$) and current can flow through the unselected memory cell. If $V_x$ is high enough, the current flowing temporarily through the unselected memory cell can be high enough to disturb its resistive state. If unselected lines 520 and 525 are clamped to a fixed voltage, as long as $V_x$ is above a diode voltage drop, some cells will see a constant current flow, which is undesirable because it could slowly affect the state of those cells.

Figure 6:
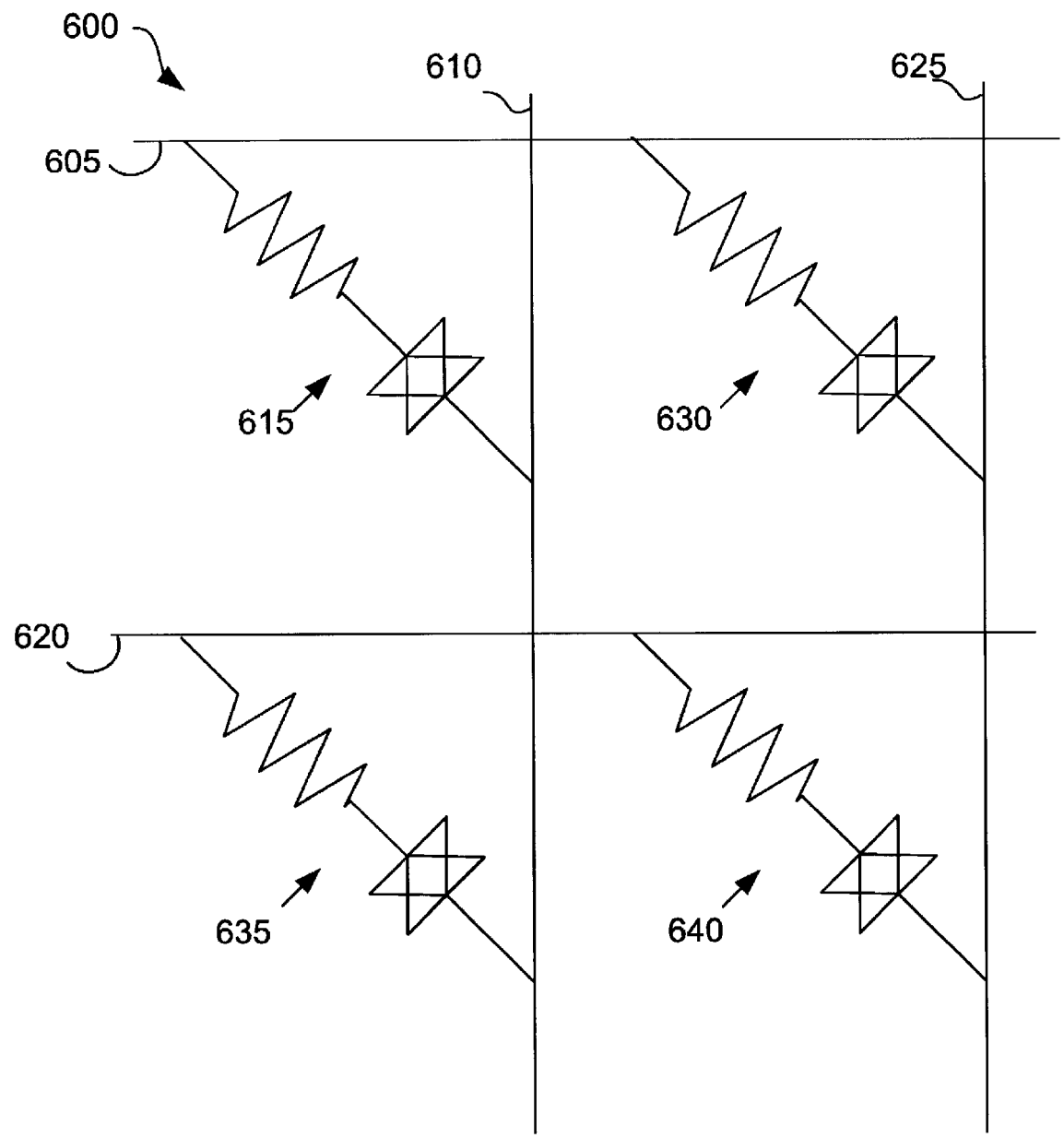
FIG. 6 depicts a circuit diagram of a simplified representation of a cross point memory array with resistive memory elements and back-to-back diodes.
Figure 7:
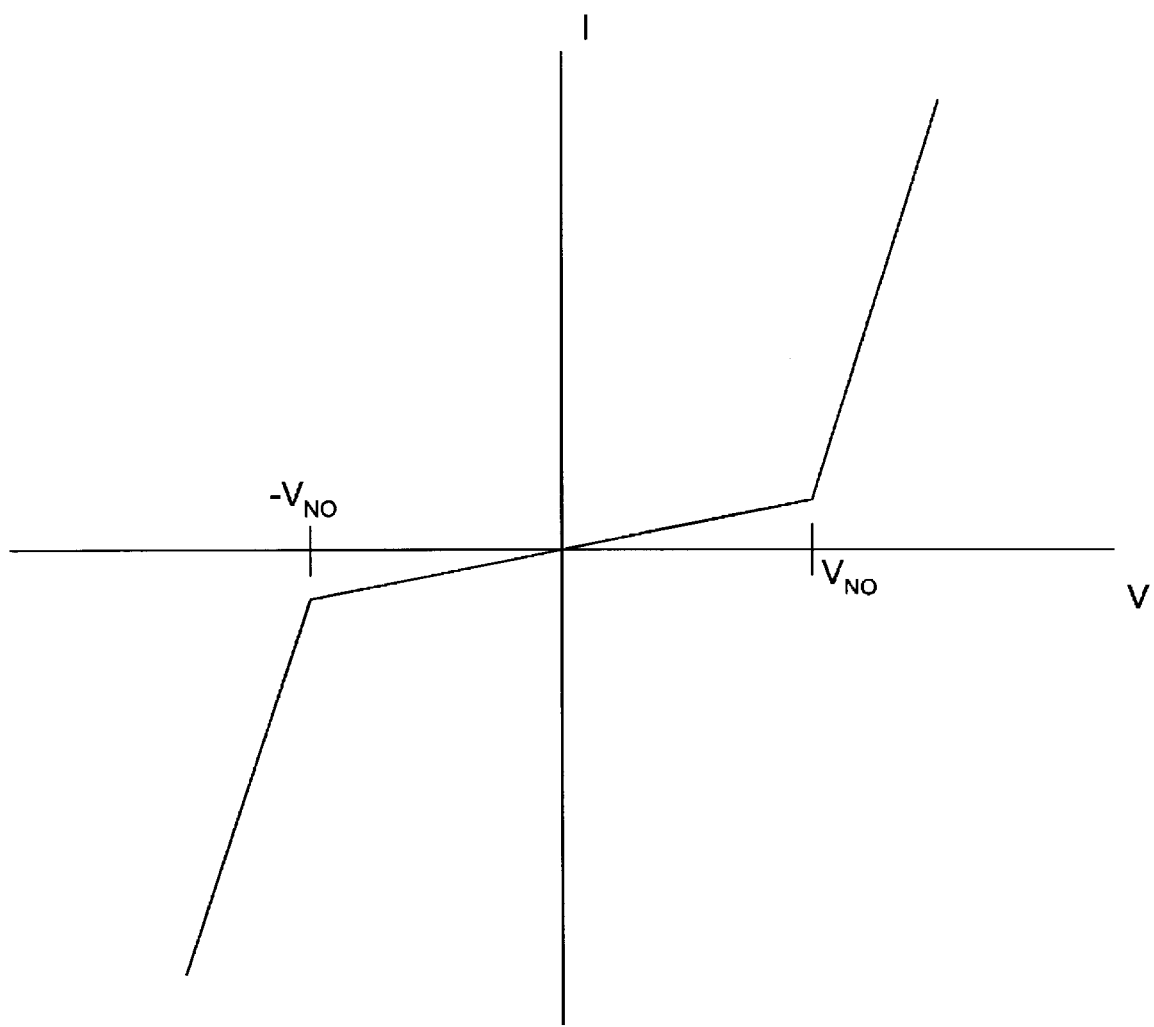
FIG. 7 depicts a graphical representation of the I-V characteristics of the back to back diode depicted in FIG. 6.

FIG. 6 depicts an exemplary cross point memory array 600 where each memory cell includes a back to back diode in series. FIG. 7 depicts the current-voltage, or "IV" characteristic of a back to back diode device. At low voltages, between $-V_{NO}$ and $+V_{NO}$, the device does not conduct or conducts only slightly. The $V_{NO}$ voltage can be referred to as the non-ohmic voltage, where conduction becomes significant. Below $-V_{NO}$ and above $+V_{NO}$, the device is conductive.

Figure 8:
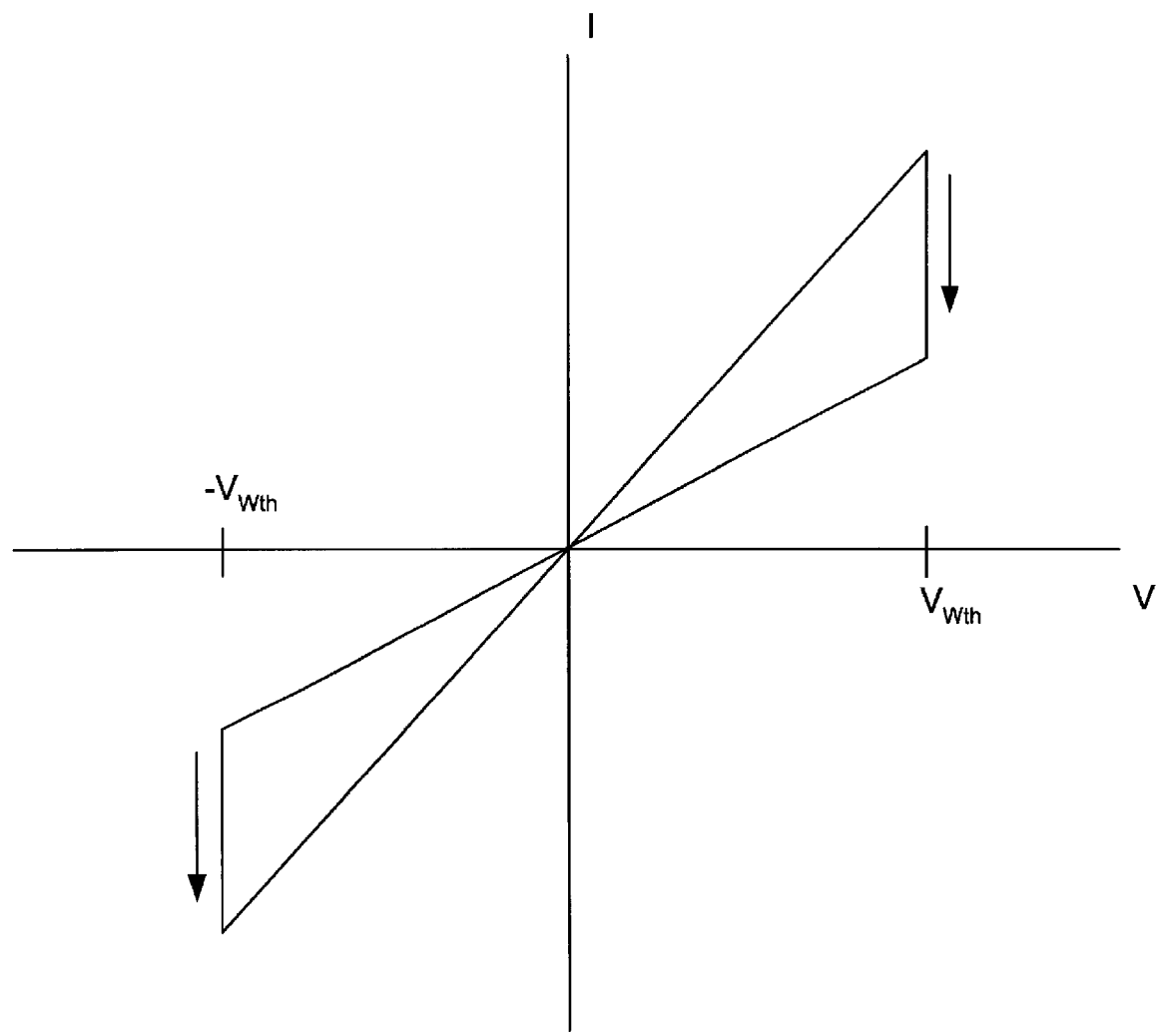
FIG. 8 depicts a graphical representation of the I-V characteristics of a resistive memory element depicted in FIGS. 4, 5 and 6.
Figure 9:
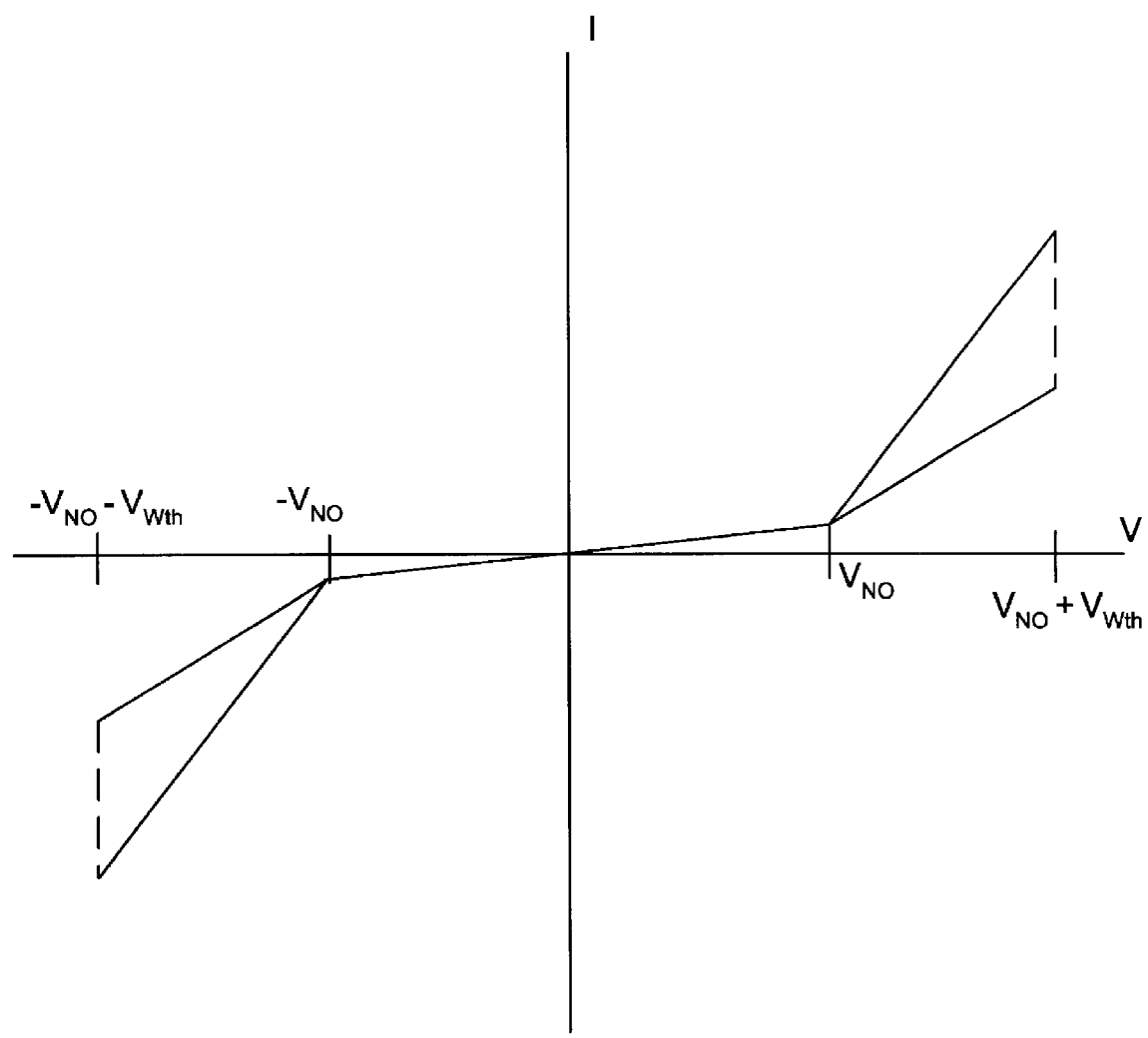
FIG. 9 depicts a graphical representation of the I-V characteristics of a resistive memory element and a back to back diode in series depicted in FIG. 6.

FIG. 8 shows the typical IV characteristic of a memory element. As a positive voltage is applied across its terminals, the memory element has a substantially linear resistance value, as a write threshold voltage $V_W$ is reached, the resistance of the memory element drops. As the voltage across the terminals is decreased and becomes negative, the memory element characteristic exhibits a lower resistance value. When the voltage across the terminals reaches a negative write threshold, the resistance state goes back to a higher value. FIG. 9 depicts the typical IV characteristics of both a CMO memory element and a back to back diode in series. The fabrication of back to back diodes has been described in co-pending application "Cross Point Memory Array Using Multiple Thin Films," U.S. application Ser. No. 10/330,512, filed Dec. 26, 2002, already incorporated by reference. A further embodiment would use two tunnel or backward diodes mounted back to back. The principal of backward diode is explained in Sze S. M., *Physics of Semiconductor Devices*, pp. 537–539, 1981, hereby incorporated by reference for all purposes. It can be realized with a N+, a P+ and another N+ layer of about 500 Å each.

Referring back to FIG. 6, one method of writing to the cross point memory array 600 is to apply $V_x=(V_{NO}+V_W)/2$, and $V_y=-(V_{NO}+V_W)/2$ on the respective selected lines 605 and 610, and to ground the unselected lines 620 and 625. This will result in the voltage across the memory element of the selected memory cell 615 to be $V_x-V_y-V_{NO}$, or $V_W$, and across the memory elements of the unselected cells 630 and 635 on a select line to be $(V_{NO}+V_W)/2-V_{NO}$, or $V_W/2-V_{NO}/2$, and across the memory elements of the unselected memory cells 640 to be 0V, since in this case the unselected lines 620 and 625 are grounded. Applying the reverse polarity voltage on the selected X and Y lines 605 and 610 will program the opposite data in the selected cell. Therefore, if $V_W$ is set to be higher than the threshold write voltage and lower than twice the threshold write voltage, the unselected cells that see $V_W/2$ across their terminals are not affected and written during the write operation.

A read operation will process similarly, replacing $V_W$ by $V_R$, a lower voltage so that $V_R$ is below the threshold write voltage. In the read case, the selected memory element will see a $V_R$ voltage across its terminal and unselected memory elements will see $V_R/2-V_{NO}/2$, or zero if this $V_R$ is less than $V_{NO}$.

During read another point of concern are leakage currents, since the read operation tries to ascertain the value of the selected cell's resistance by applying a voltage and reading a current. Any change in the read current may affect the read value. For example, if each unselected cell 635 on line 610 leaks 1 nA, and the array has 1024 cells per line, the leakage on the line would be 1023×1 nA, or 1.023 μA. Although 1.023 μA can be tolerated in many systems, a leakage of 100 nA per cell would create more than 100 μA of leakage, which could affect the proper read of the selected cell. In such a case, a smaller array, possibly 100 cells per line, would only have a 100×100 nA or 10 μA of leakage, and would still be workable.

Figure 10:
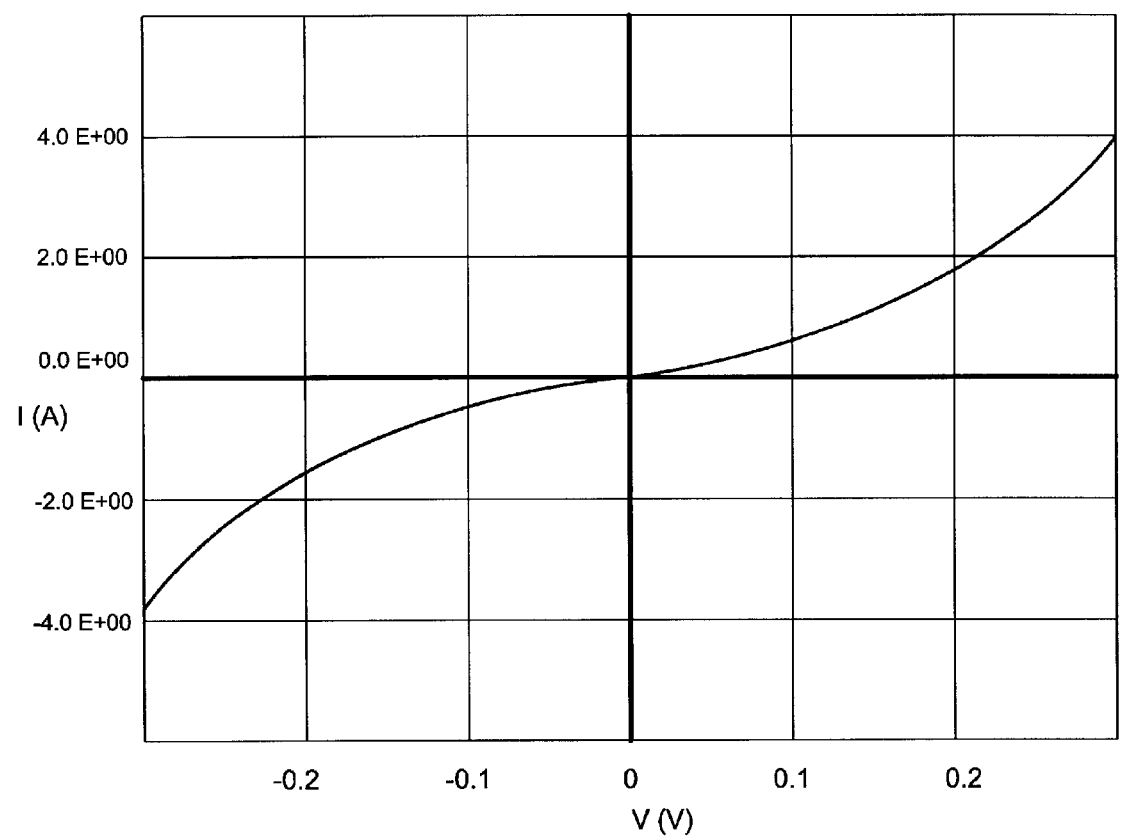
FIG. 10 depicts a graphical representation of an experimental chart of a non-linear memory element.

An alternate embodiment to the memory element and the back to back diode in series is to embed the back to back diode into the memory element, and take advantage of the non-ohmic nature of some metal/semiconductor interfaces. FIG. 10 depicts an experimental measurement of a PCMO sandwiched in Platinum electrodes, which exhibits a non-ohmic behavior. Although such material shows some leakage below $V_{NO}$, it is still applicable to smaller arrays, and may be improved to be of use in larger arrays.

To use this embodiment, the threshold write voltage of the memory element has to be adjusted. Typical non-ohmic behavior, such as Schottky effect, will result in a $V_{NO}$ below 1V. If $V_W$ is above $V_{NO}$, the unselected cells will see $(V_W-V_{NO})/2$ across the memory element, which will create an un-desirable current in the unselected memory cell. To avoid or reduce this current, it is preferable to keep $V_W$ close to or below $V_{NO}$. Therefore, the write threshold voltage will have to be adjusted, by varying the properties of the conductive metal oxide such as thickness, oxygen content, crystalline structure, stoichiometry to achieve a write threshold below $V_{NO}$.

Concluding Remarks

Although the invention has been described in its presently contemplated best mode, it is clear that it is susceptible to numerous modifications, modes of operation and embodiments, all within the ability and skill of those familiar with the art and without exercise of further inventive activity. Accordingly, that which is intended to be protected by Letters Patent is set forth in the claims and includes all variations and modifications that fall within the spirit and scope of the claim.

What is claimed is:

1. A 2-terminal re-writable memory cell, comprising:
   a non-linear resistive memory element that can store non-volatile information;
   wherein
   the resistance of the non-linear resistive memory element can be reversibly written to different values, whereby the resistance of the non-linear resistive memory is used to determine the stored information; and
   the memory cell is accessed through exactly 2 terminals.

2. The 2-terminal re-writable memory cell of claim 1, wherein the non-linear resistive memory element includes a conductive metal oxide.

3. The 2-terminal re-writable memory cell of claim 2, wherein the non-linear resistive element includes at least one electrode that interfaces with the conductive metal oxide.

4. The 2-terminal re-writable memory cell of claim 3, wherein the non-linearity is induced at the interface between at least one electrode and the conductive metal oxide.

5. The 2-terminal re-writable memory cell of claim 4, wherein the non-linear resistive element includes two electrodes that interface with the conductive metal oxide and the non-linearity is induced at the interfaces between electrodes and the conductive metal oxide.

6. The 2-terminal re-writable memory cell of claim 1, wherein the non-linearity resistive element includes a resistive memory material and a non-linear device in series.

7. The 2-terminal re-writable memory cell of claim 6, wherein the non-linear device includes two backward diodes back to back.

8. A re-writable memory comprising:
a plurality of x-direction conductive lines, each conductive line being patterned in a first direction;
a plurality of y-direction conductive lines, each conductive line being patterned in a second direction orthogonal to the first direction;
a plurality of memory cells, each memory cell being accessible for reading or writing through selection of an x-direction conductive line and a y-direction conductive line;
wherein
a memory cell is located at or near the intersection of the selected x-direction conductive array line and the selected y-direction conductive array line; and
the memory cells include a non-linear resistive element.

9. The re-writable memory of claim 8, wherein:
the non-linear resistive element includes a resistive memory element and a non-ohmic device in series.

10. The re-writable memory of claim 9, wherein:
the non-ohmic device includes two backward diodes back to back.

11. The re-writable memory of claim 8, wherein:
the non-linear resistive memory element includes a conductive metal oxide and at least one electrode.

12. The re-writable memory of claim 11, wherein:
the non-linear resistive memory element includes a conductive metal oxide and two electrodes.

13. A memory cell comprising:
a bottom electrode;
a top electrode; and
at least one conductive metal oxide sandwiched in-between the bottom and top electrodes;
wherein the memory cell exhibits a non-linear IV characteristic between the top and bottom electrodes.

14. The memory cell of claim 13, wherein:
the write threshold of the memory element is fabricated to match the non-linear IV characteristic of the memory cell.

15. The memory cell of claim 14, wherein:
the write threshold of the memory element is less than the non-ohmic voltage of the memory cell.

16. A memory cell, comprising:
a first terminal that is capable of being placed at a first voltage potential;
a non-linear device that is electrically coupled to the first terminal;
a non-volatile resistive memory element that is electrically coupled to the non-linear device; and
a second terminal that is capable of being placed at a second voltage potential and is electrically coupled to the non-volatile resistive memory element;
wherein the resistance of the non-volatile resistive memory element can be reversibly written to different values, whereby the resistance of the non-volatile resistive memory is used to determine the stored information.

17. The memory cell of claim 16, wherein:
the non-linear device includes an electrode that interfaces with the non-volatile memory element, such that the non-linearity is induced at the interface between at least one electrode and the conductive metal oxide.

18. The memory cell of claim 16, wherein:
the non-linear device includes two backward diodes in opposite directions and in series.

* * * * *

UNITED STATES PATENT AND TRADEMARK OFFICE
CERTIFICATE OF CORRECTION

PATENT NO. : 6,870,755 C1
APPLICATION NO. : 90/009668
DATED : December 13, 2011
INVENTOR(S) : Darrell Rinerson et al.

It is certified that error appears in the above-identified patent and that said Letters Patent is hereby corrected as shown below:

1. On the Front Page of the Patent, in INID Code (73) Assignee:, Please Delete the words "Gold Hill Capital"

and Replace with the following name for the Assignee "Unity Semiconductor Corporation"

Signed and Sealed this
Fourteenth Day of February, 2012

David J. Kappos
*Director of the United States Patent and Trademark Office*

(12) EX PARTE REEXAMINATION CERTIFICATE (8751st)
United States Patent
Rinerson et al.

(10) Number: US 6,870,755 C1
(45) Certificate Issued: Dec. 13, 2011

(54) RE-WRITABLE MEMORY WITH NON-LINEAR MEMORY ELEMENT

(75) Inventors: Darrell Rinerson, Cupertino, CA (US); Christophe J. Chevallier, Palo Alto, CA (US); Steven W. Longcor, Mountain View, CA (US); Wayne Kinney, Emmett, ID (US); Edmond R. Ward, Monte Sereno, CA (US); Steve Kuo-Ren Hsia, San Jose, CA (US)

(73) Assignee: Gold Hill Capital, Sunnyvale, CA (US)

Reexamination Request:
No. 90/009,668, Jan. 11, 2010

Reexamination Certificate for:
Patent No.: 6,870,755
Issued: Mar. 22, 2005
Appl. No.: 10/604,556
Filed: Jul. 30, 2003

Related U.S. Application Data
(60) Provisional application No. 60/424,083, filed on Nov. 5, 2002, provisional application No. 60/422,922, filed on Oct. 31, 2002, and provisional application No. 60/400,849, filed on Aug. 2, 2002.

(51) Int. Cl.
*G11C 11/00* (2006.01)

(52) U.S. Cl. ..................................................... 365/148
(58) Field of Classification Search .................. None
See application file for complete search history.

(56) References Cited

To view the complete listing of prior art documents cited during the proceeding for Reexamination Control Number 90/009,668, please refer to the USPTO's public Patent Application Information Retrieval (PAIR) system under the Display References tab.

*Primary Examiner* — Tuan H Nguyen

(57) ABSTRACT

A re-writable memory that uses resistive memory cell elements with non-linear IV characteristics is disclosed. Non-linearity is important in certain memory arrays to prevent unselected cells from being disturbed and to reduce the required current. Non-linearity refers to the ability of the element to block the majority of current up to a certain level, but then, once that level is reached, the element allows the majority of the current over and above that level to flow.

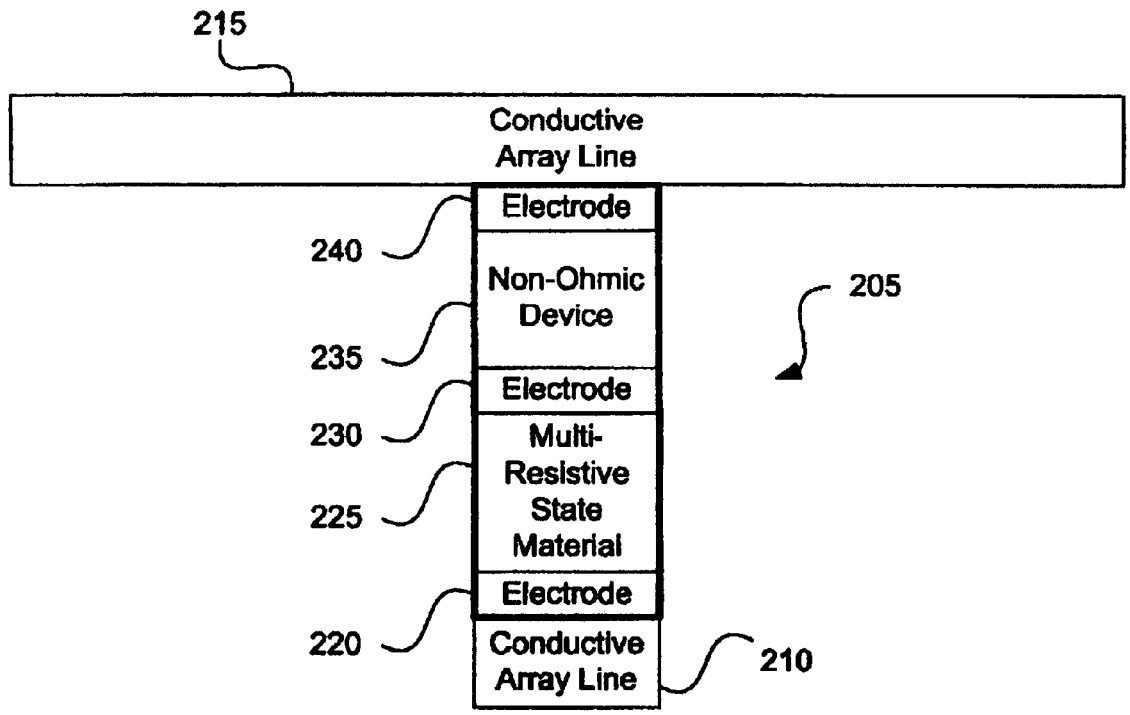

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1-6, 8-9, 11-14, and 16-17 are cancelled.

Claims 7, 10 and 18 are determined to be patentable as amended.

Claim 15 was not reexamined.

7. [The 2-terminal re-writable memory cell of claim 6,] *A 2-terminal re-writable memory cell, comprising:*
   a non-linear resistive memory element configured to store non-volatile information;
   wherein a resistance of the non-linear resistive memory element can be written from a first value to a second value and reversibly written back to the first value, whereby the resistance of the non-linear resistive memory element is used to determine the stored non-volatile information,
   *the memory cell is electrically accessed for reading and writing through exactly 2 terminals;*
   wherein the non-linear resistive memory element includes a crystalline resistive memory material and a non-linear device in series; and
   wherein the non-linear device includes two backward diodes *in a* back to back *configuration.*

10. [The re-writable memory cell of claim 9, wherein:] *A re-writable memory comprising:*
    a plurality of x-direction conductive lines, each x-direction conductive line being patterned in a first direction;
    a plurality of y-direction conductive lines, each y-direction conductive line being patterned in a second direction orthogonal to the first direction;
    a plurality of re-writable memory cells, each re-writable memory cell being electrically accessible for reading, writing and erasing through selection of an x-direction conductive line and a y-direction conductive line;
    wherein each re-writable memory cell is located at or near an intersection of the selected x-direction conductive array line and the selected y-direction conductive array line; and
    each re-writable memory cell includes a non-linear resistive memory element;
    the non-linear resistive memory element includes a resistive memory element and a non-ohmic device in series; and
    the non-ohmic device includes two backward diodes *in a* back to back *configuration.*

18. [The memory cell of claim 16, wherein:] *A memory cell, comprising:*
    *a first terminal that is capable of being placed at a first voltage potential;*
    *a non-linear device that is electrically coupled to the first terminal;*
    *a non-volatile resistive memory element that is electrically coupled to the non-linear device, the non-volatile resistive memory element is configured to store non-volatile information; and*
    *a second terminal that is capable of being placed at a second voltage potential and is electrically coupled to the non-volatile resistive memory element;*
    *wherein a resistance of the non-volatile resistive memory element can be written from a first value to a second value and reversibly written back to the first value, whereby the resistance of the non-volatile resistive memory element is used to determine the stored non-volatile information; and*
    *wherein the non-volatile resistive memory element can be electrically accessed for reading and writing through the first terminal and the second terminal, and*
    the non-linear device *is in series with the non-volatile resistive memory element and* includes two backward diodes[in opposite directions and in series] *in a back to back configuration.*

* * * * *